United States Patent [19]

Kimura

[11] Patent Number: 5,621,222
[45] Date of Patent: Apr. 15, 1997

[54] SUPERLATTICE SEMICONDUCTOR DEVICE

[75] Inventor: Mikihiro Kimura, Hyogo-ken, Japan

[73] Assignee: Mitsubishi Denki Kabushiki Kaisha, Tokyo, Japan

[21] Appl. No.: 336,622

[22] Filed: Apr. 10, 1989

Related U.S. Application Data

[63] Continuation of Ser. No. 157,498, Feb. 17, 1988, abandoned.

[30] Foreign Application Priority Data

Jul. 22, 1987 [JP] Japan .................. 62-184160

[51] Int. Cl.$^6$ .................. H01L 29/06
[52] U.S. Cl. .................. 257/21; 257/618
[58] Field of Search .................. 357/45 L, 16, 357/4, 55; 257/21, 618

[56] References Cited

U.S. PATENT DOCUMENTS 4,721,987   1/1988   Baglee et al. .................. 357/55

FOREIGN PATENT DOCUMENTS 2143083   1/1985   United Kingdom .

OTHER PUBLICATIONS

Kapon et al, "Moleculear Beam epitaxy of ... Superlattice ... on non-planar substrates", Applied Phys. Letters vol. 50, No. 6, 9 Feb. 1987, pp. 347–349.

Superlattice Negative Defferential Conductivity: "Superlattice and Negative Differential Conductivity in Semiconductors", by L. Esaki et al, Jan., 1970, pp. 61–65.

J. Appl. Phys. 58: "Resonant Tunneling Transistor with Quantum Well Base and High–Energy Injection: A New Negative Differential Resistance Device", by F. Capasso et al, 1 Aug. '85, 1366–1368.

Ext. Abstracts of the 18th Conf. on Sol. St. Dev. & Mat.: "Resonant Tunneling Through Amorphous Silicon/Silicon Nitride . . . ", by S. Miyazaki et al, Tokyo, 1986, pp. 675–678.

IEDM–86: "A Resonant–Tunneling Bipolar Transistor (RBT): A Proposal and Demonstration for New Functional Devices . . . " by T. Tutatsugi et al, 1986, 11.7, pp. 286–289.

IEDM–86: "Quantum Well Resonant Tunneling Bipolar Transistor Operating at Room Tempreture", by F. Capasso et al, 1986, 11.6, pp. 282–285.

Primary Examiner—Mark V. Prenty
Attorney, Agent, or Firm—Lowe, Price, LeBlanc & Becker

[57] ABSTRACT

A superlattice semiconductor device comprises superlattice layers (4a, 4a', 5a) stacked on the whole surface of a trench (20) formed in a semiconductor substrate or on the whole surface of a projection (30) extending from a surface of the semiconductor substrate.

1 Claim, 11 Drawing Sheets

PRIOR ART

PRIOR ART

PRIOR ART

SUPERLATTICE SEMICONDUCTOR DEVICE

This application is a continuation of application Ser. No. 07/157,498, filed Feb. 17, 1988 now abandoned.

BACKGROUND OF THE INVENTION

1. Field of the Invention

The present invention relates to a structure of a superlattice semiconductor device comprising a plurality of stacked superlattice layers.

2. Description of the Prior Art

FIG. 1 is a diagram showing a schematic structure of a conventional resonant tunneling bipolar device, which is disclosed, for example, in IEEE IEDM Technical Digest, 1986, p. 282, and IEEE IEDM Technical Digest, 1986, p. 286. In FIG. 1, the conventional resonant tunneling bipolar device comprises an n type GaAs semiconductor substrate 6b, a p type GaAs semiconductor layer 3b formed on the GaAs substrate 6b, a first AlAs superlattice layer 4b formed on the p type semiconductor layer 3b, a GaAs superlattice layer 5b formed on the superlattice layer 4b, a second AlAs superlattice layer 4b' formed on the superlattice layer 5b, a p type GaAs semiconductor layer 3b' formed on the superlattice layer 4b', and an n type AlGaAs semiconductor layer 2b' formed on the semiconductor layer 3b'. In this structure, the GaAs superlattice layer 5b defines a well region forming a quantum well, and the AlAs superlattice layers 4b and 4b' formed on the upper and lower surfaces of the superlattice layer 5b function as a barrier region. Each of the GaAs superlattice layer 5b and the AlAs super lattice layers 4b and 4b' has a thickness of about several tens Å, and they form a superlattice structure with hetero junction. In this structure, the n type AlGaAs semiconductor layer 2b' is connected to an emitter electrode E, the p type GaAs semiconductor layer 3b is connected to a base electrode B, and the n type GaAs semiconductor substrate 6b is connected to a collecter electrode C.

FIG. 2 is a diagram showing a structure of another conventional superlattice device, that is, showing schematically a cross-sectional structure of a resonant tunneling device (diode) using amorphous silicon. In FIG. 2, the resonant tunneling diode comprises an n type silicon semiconductor substrate 6c, an amorphous silicon layer (referred to as an a-Si:H layer hereinafter) 3c formed on the semiconductor substrate 6c having P type impurities, such as phosphorous, introduced, an amorphous $Si_3N_4$:H superlattice layer 4c formed on the a-Si:H layer 3c, an a-Si:H superlattice layer 5c formed on the superlattice layer 4c having P type impurities introduced, an a-$Si_3N_4$:H superlattice layer 4c' formed on the superlattice layer 5c, and an a-Si:H layer 3c' formed on the superlattice layer 4c' having P type impurities introduced. The p type a-Si:H layer 3c' is connected to an anode electrode A, and the n type silicon semiconductor substrate 6c is connected to a cathode electrode K. In this structure, the a-Si:H superlattice layer 5c having P type impurities introduced defines a well region, and the a-$Si_3N_4$:H superlattice layers 4c and 4c' formed on the upper and lower surfaces thereof define a barrier region. In addition, each of the superlattice layers 4c, 5c has a thickness of about several tens Å, and they form a superlattice quantum well structure.

As shown in FIGS. 1 and 2, the conventional superlattice semiconductor device having a superlattice structure has a planar type of structure formed by sequentially stacked layers on the surface of a semiconductor substrate. The stacked layers lie along side of each other. Description is now made on operation of the principle of a resonant tunneling device which is one of the superlattice semiconductor device.

FIG. 3 is a diagram for illustrating the principle of operation of the resonant tunneling device. Referring now to FIG. 3, description is made on the principle of operation of the resonant tunneling device. In FIG. 3, a potential diagram of a diode which is one of the resonant tunneling devices is shown by way of an example. If a semiconductor layer (a well region) having a thickness similar to a de Broglie wavelength of an electron, such as about several nm (nanometers) and a narrow band gap is interposed between semiconductor layers (barrier regions) each having almost the same thickness and a wide band gap, and further semiconductor layers each having a narrow band gap are provided on the opposite sides of the barrier layers, an energy band structure as shown in FIG. 3A is obtained. More specifically, the bottom of the band in the well region is lower than those in barrier regions on both sides, so that a well structure is formed. In such a state, the energy level in the well region interposed between the barriers is quantized. At that time, the discrete energy quantum levels are produced, so that electrons are strongly bound by the quantum levels. In other words, although in the well region, electrons can serve as free electrons in two-dimensional directions, electrons can take only the discontinuous energy levels in the direction of depth (the direction of the depth of a well).

In such a state, voltage is applied between an anode and a cathode as shown in FIG. 3B. When the potential at the cathode becomes equal to a quantum level E1 of the well ($V=V_{RT1}$), the resonant tunneling effect is produced, so that electrons can pass through the barrier layers. At that time, the probability of tunneling of electrons is about 1.

Subsequently, a voltage is applied between the anode and the cathode. When the bottom of the conduction band of the cathode reaches a level between the quantum levels E1 and E2 formed in the well region, as shown in FIG. 3C, the tunneling probability of electrons is decreased, so that current flowing through the well region is decreased. so-called negative (differential) resistance is produced.

FIG. 3D is a diagram showing the relation between voltage V applied between the anode and the cathode and current I flowing therebetween. As shown in FIG. 3D, in the resonant tunneling device, when the voltage applied between the anode and the cathode is increased, the value of current flowing therebetween has a crest and a trough. A phenomenon that the negative (differential) resistance is produced due to such a resonant tunneling effect is introduced by L. Esaki et al., in IBM Res. Note, RC-2418, 1969, and IBM, J. Res. Develop., 1970, p. 61.

Application as shown in FIGS. 4 to 7 is proposed as a device utilizing such a resonant tunneling effect.

FIG. 4 is a diagram showing the relation between voltage $V_{EB}$ applied between a base and an emitter and collector current Ic in a single resonant tunneling bipolar transistor. A single superlattice semiconductor device can form a flip-flop circuit by utilizing a crest and a trough of the Ic-$V_{EB}$ characteristics. In addition, if and when the resonant tunneling bipolar transistor is used as a transistor in a circuit structure as shown in FIG. 5A, the characteristic of output voltage Your periodically repeating a crest and a trough in response to input voltage Vin as shown in FIG. 5B when the value of the input voltage Vin applied to the base B of the resonant tunneling bipolar transistor A is changed, so that a voltage translator circuit can be formed by a single transistor. Furthermore, when voltages V1 to Vn are applied in parallel to a base B of a resonant bipolar transistor A as shown in FIG. 6, the output voltage Vout is periodically changed in response to the value of voltage applied to an input (the base) of the bipolar transistor A. Therefore, if the input voltages V1 to Vn are used as binary code inputs of "1" and "0", parity bits "1" and "0" can be generated in accordance with the binary code input. As a result, a single superlattice semiconductor device can form a parity bit generator. Additionally, in a circuit structure as shown in FIG. 7A, the collector current Ic is periodically changed in response to voltage $V_{CE}$ applied between a collector C and an emitter E of the resonant tunneling bipolar transistor A, so that the voltage $V_{CE}$ between the collector C and the emitter E is latched to one among values of 1 to 3 in response to the value of the input voltage Vin. As a result, a single semiconductor device can form a multivalued memory circuit. The above described circuit structures and characteristics shown in FIGS. 4 to 7 are disclosed in, for example, Journal of Applied Physics, Vol. 58, 1985, p. 1366.

As described in the foregoing, in the conventional superlattice semiconductor device, a single semiconductor device can perform various circuit functions. However, since the structure is of a planar type in which semiconductor layers are stacked in parallel on the surface of a semiconductor substrate, the area of the superlattice semiconductor device is substantially decreased so that current flowing therethrough is substantially decreased in a very large scale integrated circuit, such as a 64 MDRAM, formed in accordance with a design rule of less than about 0.1 μm, and then a negative (differential) resistance phenomenon does not clearly occur. In addition, even if a crest and a trough appear in the current characteristic due to the resonant tunneling effect, the difference between the crest and the trough is so small that the function of switching cannot be sufficiently performed and accordingly malfunction switching tends to occur.

SUMMARY OF THE INVENTION

An object of the present invention is to solve the above described problems of a conventional superlattice semiconductor device and to provide a superlattice semiconductor device capable of sufficiently displaying characteristics such as high speed switching operation, multivalued logical operation and light communication, even in a large-scale integrated circuit produced by very fine structure processing in, for example, a 64 M or more DRAM, a device for an ASIC (application specific IC), AI (artificial intelligence), a light receiving element or the like.

In the superlattice semiconductor device according to the present invention, at least three or more superlattice layers each having a thickness which is almost the same as or less than a de Broglie wavelength of an electron are stacked on the bottom portion and the side surface portion of the trench region or the upper surface or top portion and the side surface portion of the projection.

Preferably, an interconnection contact region for providing electrical contact to the superlattice semiconductor device is formed on the surface of a semiconductor substrate in a region other than the trench region or the convex region.

Since the superlattice semiconductor device according to the present invention uses a trench structure or a convex structure, the area in the sidewall portion can be sufficiently utilized. Therefore decrease in the occupied area of the device can be sufficiently compensated for even if the occupied area is decreased with very fine structure processing, so that the area of a tunneling region of the device does not decrease thereby to provide a sufficient current flow. Accordingly, desired operation characteristics can be achieved without destroying the negative (differential) characteristics due to the resonant tunneling effect.

Furthermore, if and when the interconnection contact region of the superlattice semiconductor device is formed on the surface of the semiconductor substrate in a region other than the trench region or the convex region, occurrence of a leak, a short or the like and decrease in breakdown voltage can be prevented, so that a superlattice semiconductor device can be achieved with high reliability.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 10A is a plan view thereof and FIG. 10B is a diagram showing a cross-sectional structure taken along a line A—A shown in FIG. 10A;

FIG. 11A is a diagram showing a plan layout and FIG. 11B is a diagram showing schematically a cross-sectional structure taken along a line B—B shown in FIG. 11A;

FIG. 12A is a plan view thereof, FIG. 12B is a diagram showing a cross-sectional structure taken along a line D—D shown in FIG. 12A and FIG. 12C is a diagram showing schematically a cross-sectional structure taken along a line C—C shown in FIG. 12A;

DESCRIPTION OF THE PREFERRED EMBODIMENTS

Referring now to FIGS. 8 to 13, an embodiment of the present invention is described.

Figure 1:
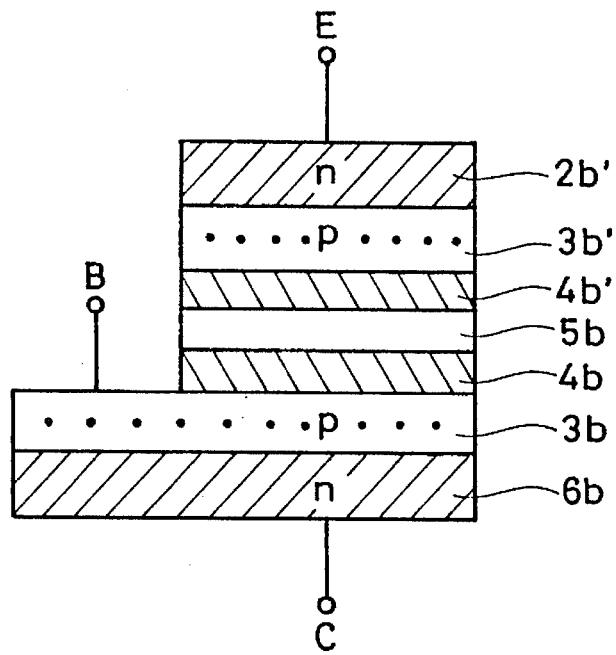
FIG. 1 is a diagram showing a schematic cross-sectional structure of an example of a conventional superlattice semiconductor device, that is, showing schematically a cross-sectional structure of a resonant tunneling bipolar transistor.
Figure 2:
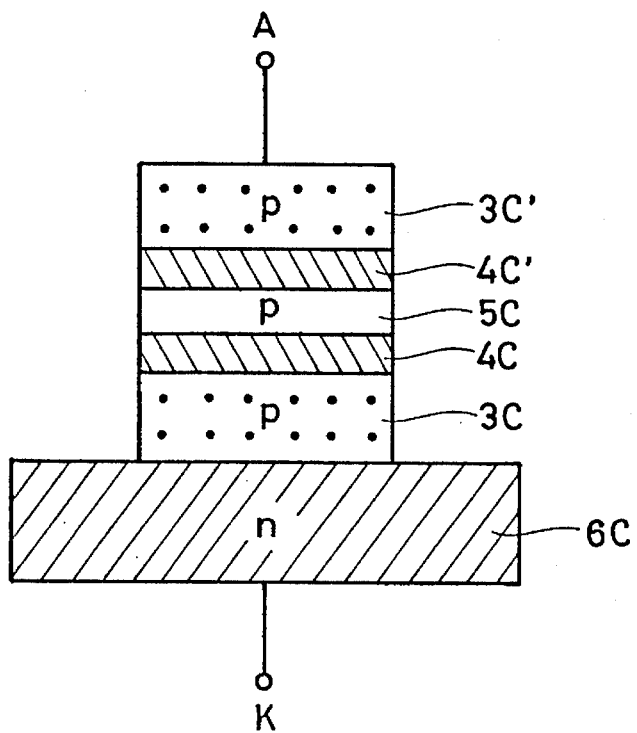
FIG. 2 is a diagram showing a schematic cross-sectional structure of another conventional resonant tunneling superlattice semiconductor device, that is, showing a schematic cross-sectional structure of a resonant tunneling diode.
Figure 3A:
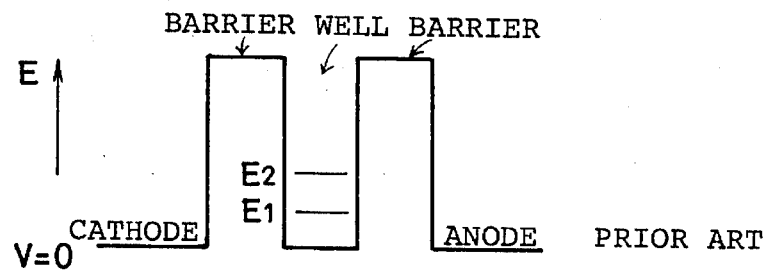
FIGS. 3A to 3D are diagrams showing schematically operation of the resonant tunneling diode, that is, showing the energy band profile of a conduction band and the current-voltage characteristics in the resonant tunneling diode.
Figure 3B:
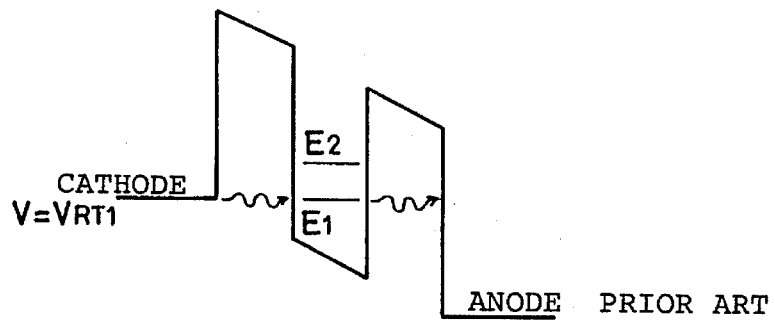
Figure 3C:
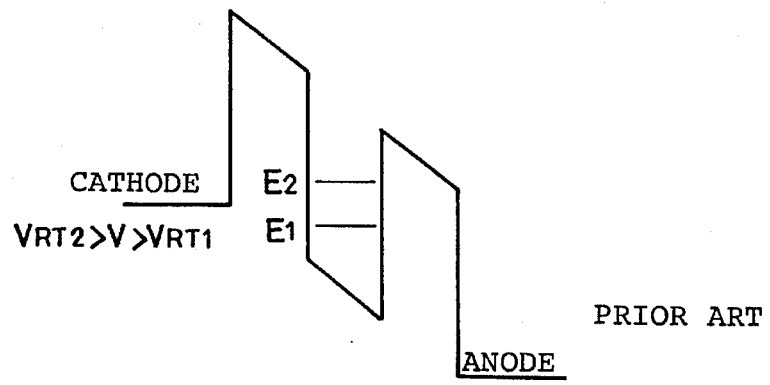
Figure 3D:
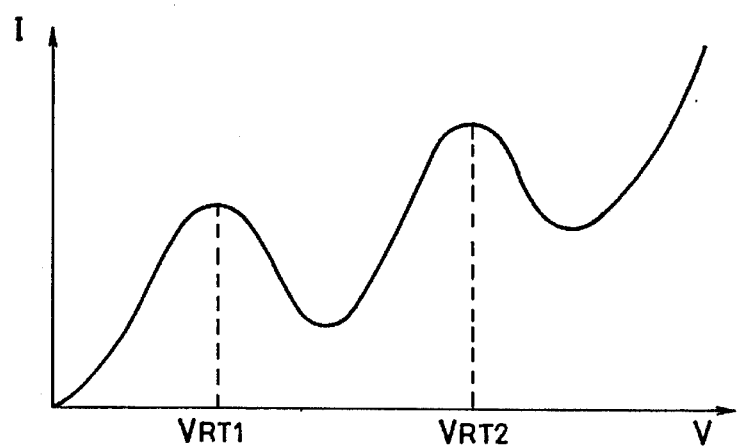
Figure 4:
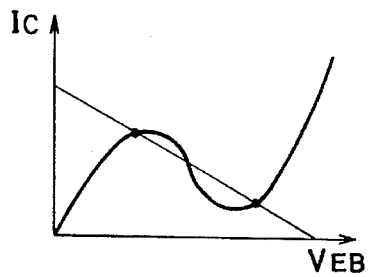
FIG. 4 is a diagram showing the current-voltage characteristics in a circuit structure using the superlattice semiconductor device, that is, showing the characteristics of collector current Ic-voltage $V_{EB}$ between an emitter and a base when the resonant tunneling bipolar transistor forms a flip-flop.
Figure 5A:
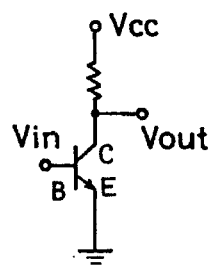
FIGS. 5A and 5B are diagrams showing another example of the circuit structure using the conventionally proposed superlattice semiconductor device, that is, showing a structure of a voltage modulating circuit and the relation between input voltage Vin and output voltage Vout at that time.
Figure 5B:
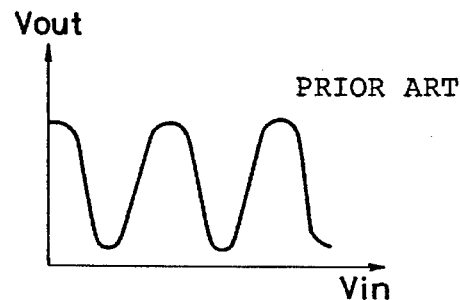
Figure 6:
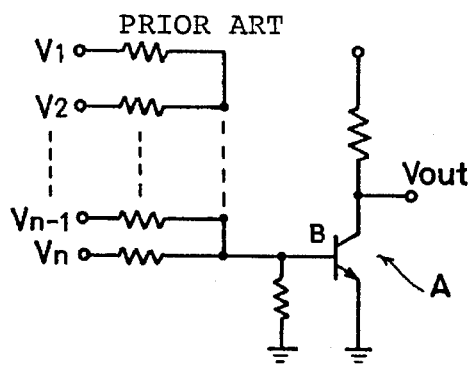
FIG. 6 is a diagram showing an example of a structure of a parity bit generator in a conventionally proposed binary code.
Figure 7A:
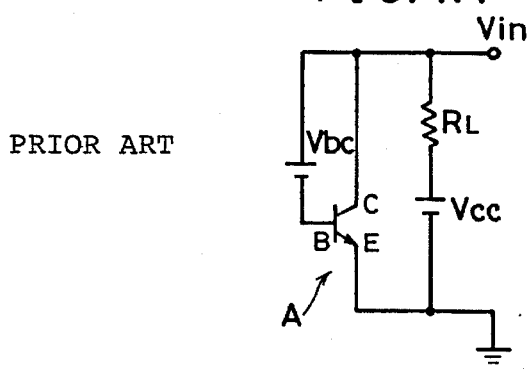
FIGS. 7A and 7B are diagrams showing schematically a circuit structure and the relation between collector current Ic and voltage $V_{CE}$ between a collector and an emitter when a conventionally proposed multivalued memory is formed of the resonant tunneling bipolar transistor.
Figure 7B:
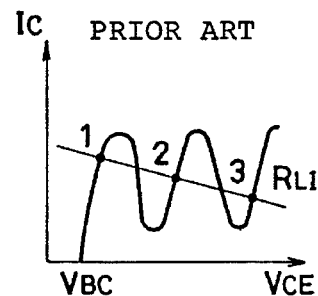
Figure 8:
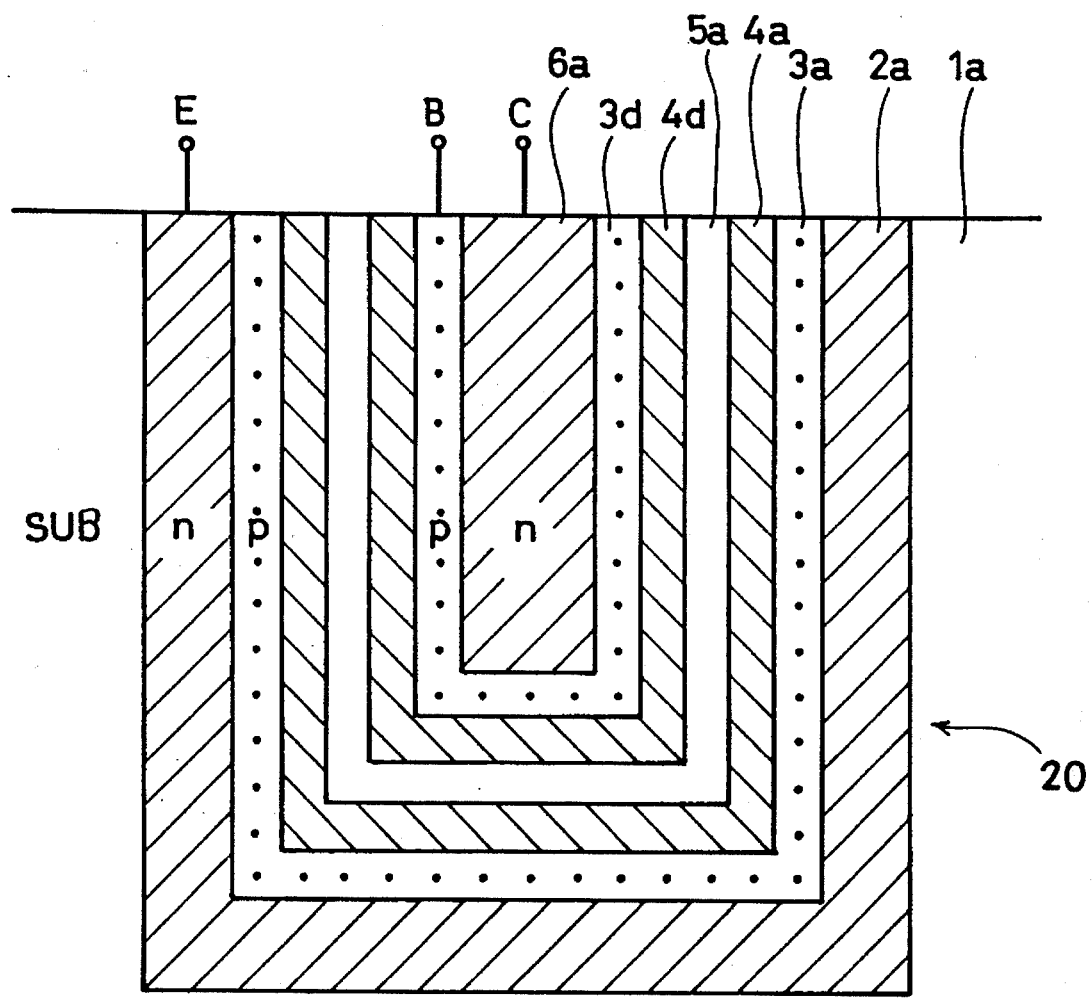
FIG. 8 is a diagram showing a schematic cross-sectional structure of a superlattice semiconductor device according to an embodiment of the present invention, where trench regions are formed within a semiconductor substrate.

FIG. 8 is a diagram showing an example of a structure of a superlattice semiconductor device according to an embodiment of the present invention, where a trench region is formed on the surface of a semiconductor substrate. In FIG. 8, a trench region 20 is formed in the surface of a GaAs semiconductor substrate 1a to compensate for decrease in the area occupied by the device. A superlattice structure is formed on the bottom portion and the sidewall portion of the trench region 20, so that a single resonant tunneling bipolar transistor is formed. In FIG. 8, an N type AlGaAs layer 2a serving as an emitter region is first formed on the bottom portion and the sidewall portion of the trench region 20, and a P type GaAs layer 3a, an AlAs superlattice layer (barrier layer) 4a, a GaAs superlattice layer (well layer) 5a, an AlAs superlattice layer (a barrier layer) 4a', a P type GaAs layer 3a' and an N type GaAs layer 6a are sequentially formed on the emitter layer 2a. The P type GaAs layers 3a and 3a' define a base region and the N type GaAs layer 6a defines a collector layer. In addition, the GaAs superlattice layer 5a serving as a well region has a thickness which is almost the same as or less than a de Broglie wavelength of an electron (about several 10 nm), and each of the AlAs superlattice layers (barrier layers) 4a and 4a' on the either sides of the well layer (superlattice layer) 5a has a thickness which is almost equal to or less than the de Broglie wavelength of an electron and a wider band gap than that of the well layer (as compared with the superlattice layer 5a forming the well layer). In such a structure, even if the plane area of the superlattice semiconductor device observed from the upper portion in FIG. 8 is fined and decreased, the entire superlattice layer can have a sufficiently large area because a superlattice structure is also formed in the sidewall portion of the trench region 20 as well as the bottom portion of the trench 20, so that a super lattice semiconductor device capable of showing sufficient negative (differential) resistance characteristics can be achieved.

FIGS. 9A to 9D are diagrams showing schematically the manufacturing processes of the superlattice semiconductor device having the trench structure shown in FIG. 8. Referring now to FIGS. 9A to 9D, description is made on a manufacturing method of the superlattice semiconductor device according to an embodiment of the present invention.

Figure 9A:
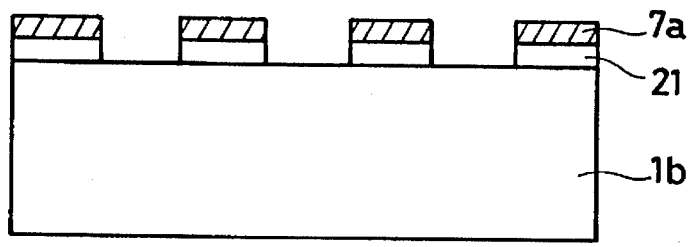
FIG. 9A to 9D are diagrams showing schematically manufacturing processes of a superlattice semiconductor device comprising trench regions according to an embodiment of the present invention.

As shown in FIG. 9A, a high temperature oxide film 21 formed in a predetermined region on a GaAs substrate 1b (semiconductor substrate), and a resist 7a having a predetermined shape is formed on the high temperature oxide film 21 so that the semiconductor substrate 1b other than a region to be a trench is covered with the resist 7a.

Figure 9B:
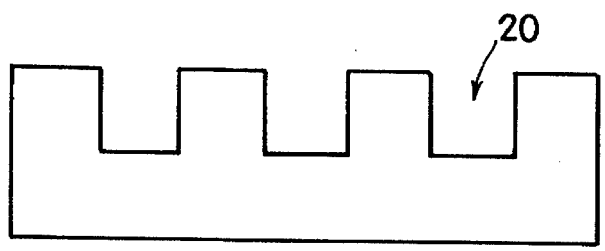

In FIG. 9B, the semiconductor substrate 1b is etched utilizing the resist 7a as a mask by a dry etching to form the trench 20 having a predetermined depth. The high temperature oxide film 21 and the resist 7a are then removed.

Figure 9C:
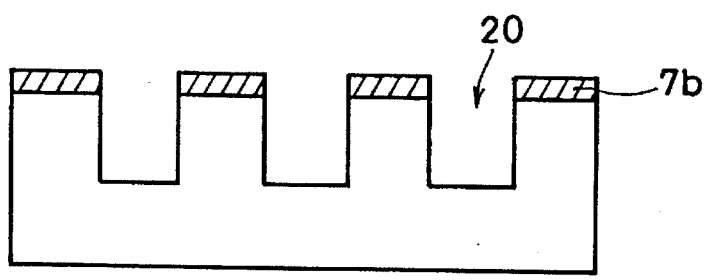
Figure 9D:
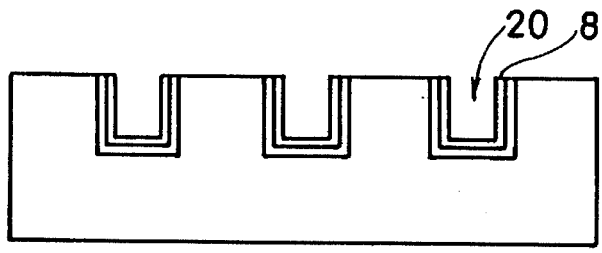

In FIG. 9C, a resist 7b is formed on the semiconductor substrate 1b in a region other than the trench region 20, layers each having a predetermined thickness and a predetermined component are sequentially formed utilizing the resist 7b as a mask by conventional MBE (molecular beam epitaxy), MOCVD (metal organic chemical vapor deposition) or the like, and the superlattice structure shown in FIG. 8 is formed on the bottom portion and the sidewall of the trench 20, so that a superlattice structure 8 is achieved. Therefore, a semiconductor device comprising a superlattice structure with a sufficient area can be achieved.

After the superlattice structure 8 is formed in the trench region 20, electrical contact must be provided to each layer (an emitter, a base and a collector) included in the superlattice structure using an aluminum (Al) interconnection or the like. However, since the plane area is very small, it is very difficult to form all contacts in the trench region 20. Thus, in such a case, if the superlattice structure is formed such that a layer to which electrical contact is to be provided extends to the surface of the semiconductor substrate 1b, electrical contact can be provided on the surface of a semiconductor substrate in a region other than the trench region 20. Thus, occurrence of a leak and decrease in breakdown voltage can be prevented which are caused by contact of a contact region with an adjacent layer which could occur if the contact region is formed in the trench region. In addition, if electrical contact is provided on the surface of the semiconductor substrate, limitation to a shape (a pattern and a layout) of a layer underlying the layer to which electrical contact is provided can be removed. Various methods for providing such electrical contact are considered.

Figure 10A:
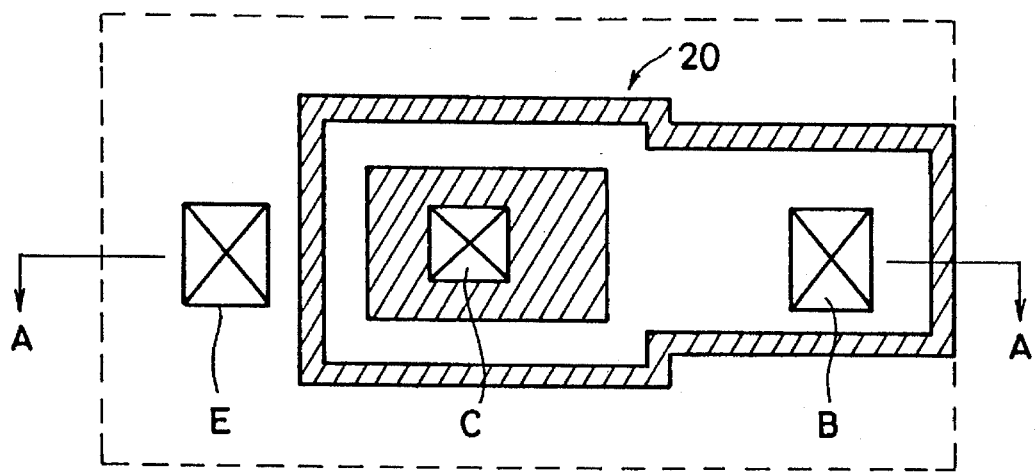
FIGS. 10A and 10B are diagrams showing an example of a layout of a contact region for providing electrical contact in a superlattice semiconductor device comprising trench regions, where
Figure 10B:
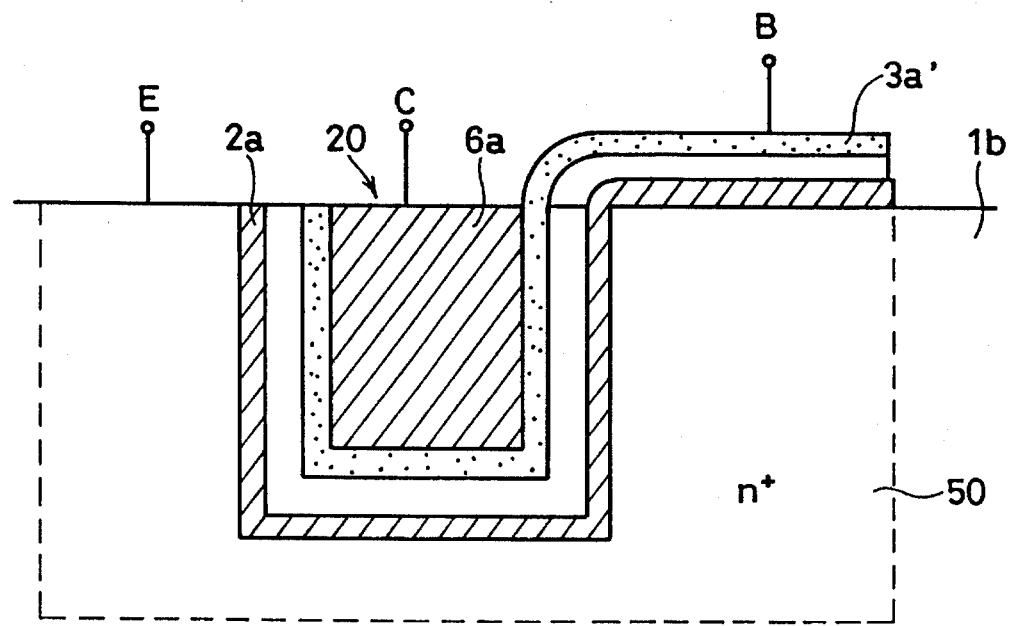

FIGS. 10A and 10B are diagrams showing an example of a method for providing an electrical contact in the superlattice semiconductor device comprising the trench structure, where FIG. 10A is a plan view thereof and FIG. 10B is a diagram showing schematically a cross-sectional structure taken along a line A—A shown in FIG. 10A. For simplicity of illustration, only the minimum of layers are shown in FIG. 10B. As shown in FIGS. 10A and 10B, the trench region 20 is formed in an N⁺ layer (an N type impurity diffusion layer having a high concentration) 50 formed in the semiconductor substrate 1b, and the N⁺ layer 50 is provided with a contact region for making connection with an emitter electrode E. A base layer 3a' is formed to extend from the trench region 20 to the surface of the semiconductor substrate 1b (the N⁺ diffusion layer 50), and a contact region for providing electrical contact to a base electrode B on the surface of the semiconductor substrate 1b is formed. A contact region to be connected to a collector electrode C is formed in the trench region 20. In this structure r the distance between electrodes can be increased and the area of a layer to which contact is to be provided can be sufficiently increased, as compared with a case in which a base contact region, an emitter contact region and a collector contact region are formed in the trench region 20, so that occurrence of a leak or the like between the contact region and an adjacent layer can be prevented in the contact region.

Figure 11A:
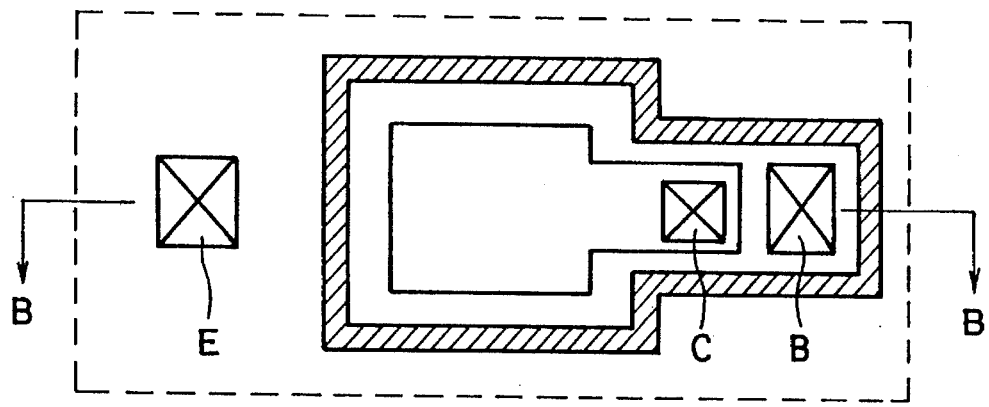
FIGS. 11A and 11B are diagrams showing another example of a layout of a contact region for providing electrical contact in a superlattice semiconductor device comprising trench regions, where
Figure 11B:
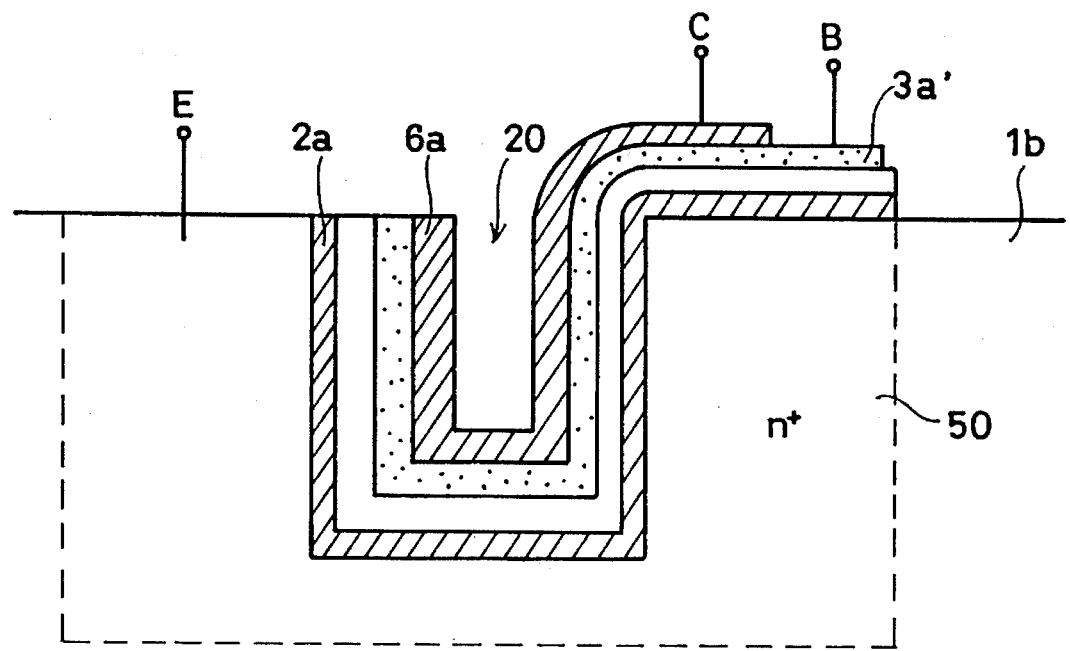

FIGS. 11A and 11B are diagrams showing another example of a structure of a superlattice semiconductor device comprising trench regions according to another embodiment of the present invention, where FIG. 11A is a diagram showing a plane structure thereof and FIGS. 11B is a diagram showing schematically a cross-sectional structure taken along a line B—B shown in FIG. 11A. In FIG. 11B, only the minimum of layers are shown. As shown in FIGS. 11A and 11B, a contact region for connecting the emitter electrode E to an emitter layer 2a is provided in an N⁺ layer 50, and a base layer 3a' and a collector layer 6a are formed to extend from a trench region 20 to the surface of a semiconductor substrate 1b so that a contact region for connecting the base layer 3a' to a base electrode B and a contact region for connecting the collector layer 6a to a collector electrode C are formed on the surface of the semiconductor substrate 1b.

Figure 12A:
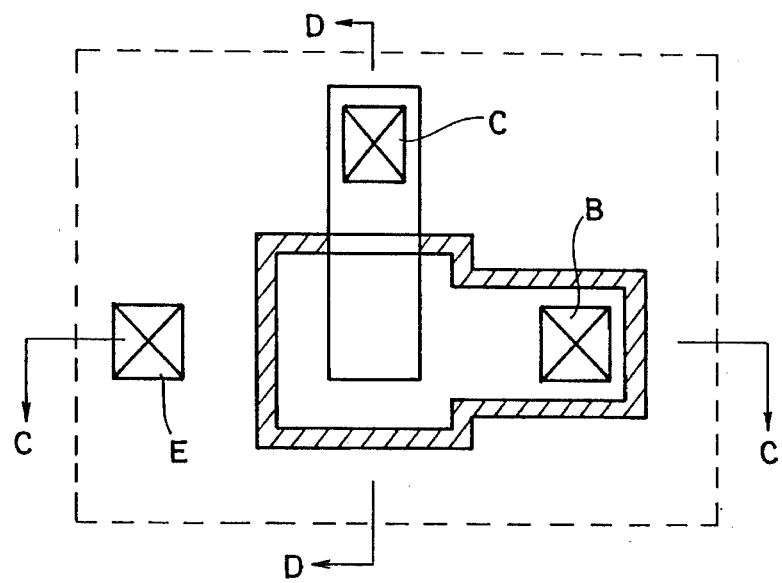
FIGS. 12A to 12C are diagrams showing an example of still another layout of a contact region in a superlattice semiconductor device comprising trench regions, where
Figure 12B:
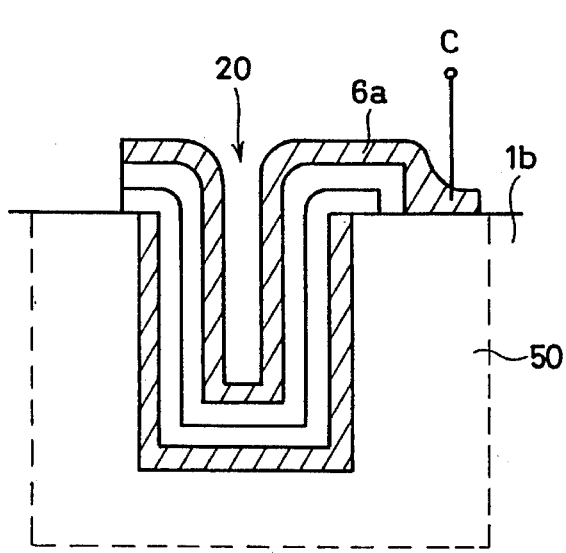
Figure 12C:
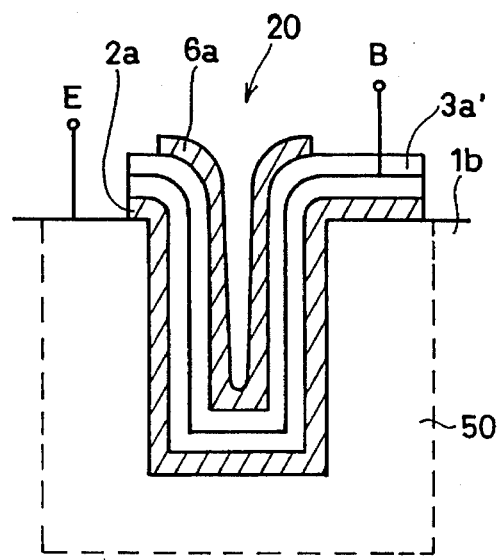

FIGS. 12A, 12B and 12C are diagrams showing a structure of a superlattice semiconductor device comprising trench structures according to still another embodiment of the present invention, where FIG. 12A is a diagram showing a plane structure thereof, FIG. 12B is a diagram showing a cross-sectional structure taken along a line D—D shown in FIG. 12A, and FIG. 12C is a diagram showing a cross-sectional structure taken along a line C—C shown in FIG. 12A. As shown in FIGS. 12A to 12C, a collector electrode layer 6a is formed to extend from a trench region 20 to a semiconductor substrate 1b (an N⁺ diffusion layer 50) in the direction perpendicularly intersecting a line connecting a contact region for an emitter electrode E to a contact region for a base electrode, and a contact region for connecting the collector layer 6a to a collector electrode C is formed on the surface of the semiconductor substrate 1b. On the other hand, a contact region for electrically connecting the emitter electrode E to an emitter layer 2a and a contact region for connecting a base layer 3a' to a base electrode B are formed on the surface of the semiconductor substrate 1b in a region extending in right and left directions of the trench region 20 shown in FIG. 12A.

In such a layout of the contact, a superlattice semiconductor device is provided in which a leak, a short-circuit or the like can never occur and breakdown voltage never decreases.

Figure 13A:
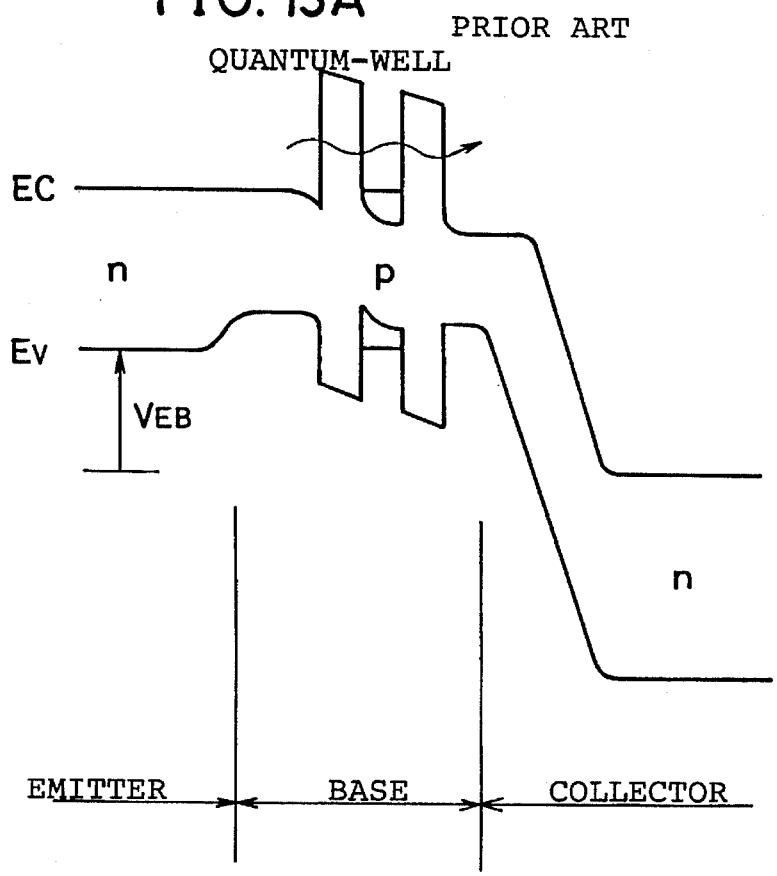
FIG. 13A is a diagram showing schematically an example of the energy band profile in a resonant tunneling bipolar transistor according to an embodiment of the present invention.
Figure 13B:
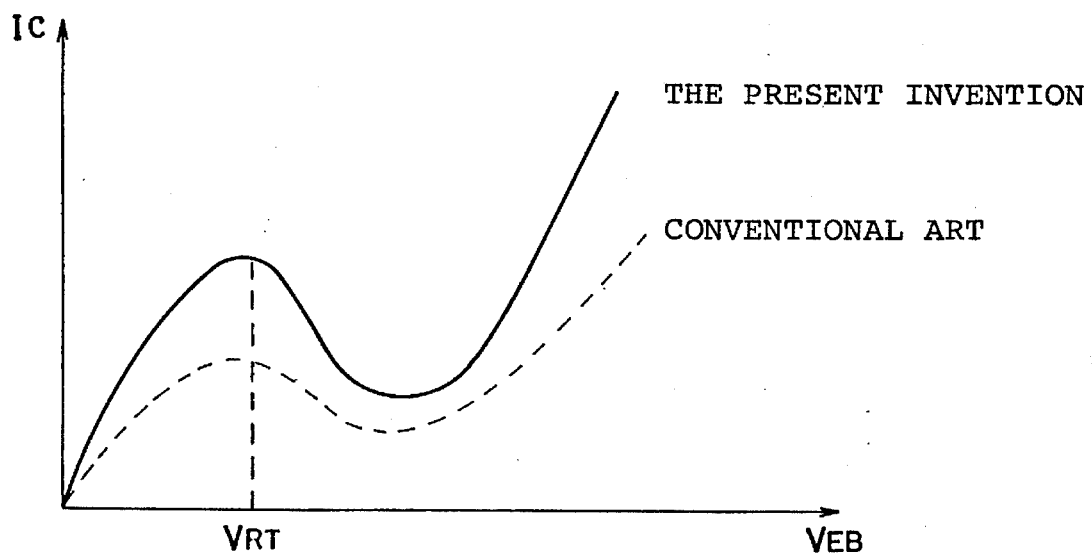
FIG. 13B is a diagram showing schematically the relation between collector current Ic and voltage $V_{EB}$ between an emitter and a base in the resonant tunneling bipolar transistor shown in FIG. 13A.

Description is now made on the principle of operation of a resonant tunneling bipolar transistor according to the present invention and the application thereof. FIG. 13A is a diagram showing an example of the potential energy distribution of the resonant tunneling bipolar device having an NPN structure according to the present invention, and FIG. 13B is a diagram showing the characteristics of collector current Ic-voltage $V_{EB}$ between an emitter and a base in the resonant tunneling bipolar device. In the resonant tunneling bipolar device of the NPN structure having a superlattice structure as shown in FIG. 13A, a quantum well is formed in a P type base region. In addition, band bending occurs in the quantum well region. This is caused by the effect of doping of impurities. In a well layer (the GaAs superlattice layer 5a in FIG. 8), the energy level is quantized. In this state, the voltage $V_{EB}$ between an emitter and a base is gradually increased. When a conduction band Ec (a conduction band in an emitter region) and a quantum level in the quantum well region coincide with each other, the resonant tunneling effect is produced, so that the tunneling probability of electrons is about 1.

Furthermore, when the voltage $V_{EB}$ between an emitter and a base is increased, the tunneling probability of electrons is less than 1, so that the negative (differential) resistance effect is produced. If and when the resonant tunneling effect is produced ($V_{EB}=V_{RT}$), electrons flow from the emitter region to a collector region by a resonant tunneling phenomenon, so that the collector current Ic has the maximal value at the voltage.

When the voltage $V_{EB}$ is increased again, the resonant tunneling effect is not produced, so that the value of current flowing from the emitter region to the collector region is decreased, and the negative (differential) resistance effect is produced. In addition, the collector current Ic is decreased, so that a trough region (the minimal value) appears.

If and when the resonant tunneling bipolar device having a superlattice structure is used, the surface area (the plane area) becomes very small by very fine structure processing, the value of current flowing through the quantum well region is substantially decreased. As a result, the difference between a crest and a trough of the collector current Ic is decreased as represented by a broken line in FIG. 13B, so that sufficient switching characteristics are not obtained.

However, if a trench region is provided and a superlattice structure is formed in the trench region as shown in the embodiment of the present invention, the area of the sidewall portion in the trench region can be utilized as the area for the superlattice structure even if the plane area of the trench region is decreased by very fine structure processing. As a result, decrease in the area of the superlattice structure can be eliminated, so that sufficient switching characteristics (i.e., a very large difference between the crest and the trough of the collector current Ic, can be obtained as represented by the solid line in FIG. 13B.

Thus, a circuit device having the characteristics as shown in FIGS. 4 to 7 can be achieved even by very fine structure processing, so that a superlattice semiconductor device capable of surely operating without being affected by decrease in the area by very fine structure processing can be achieved.

Although in the above described embodiment, a structure and operation of a resonant tunneling bipolar device were described, the present invention can be also applied to a resonant tunneling diode.

Furthermore, although in the above described embodiment, the resonant tunneling device having a superlattice structure was described using GaAs hetero junction, the superlattice structure may be achieved using a silicon semiconductor substrate or amorphous silicon, in which case the present invention can be applied. If and when a superlattice semiconductor device is achieved using amorphous silicon, it is necessary that the semiconductor substrate $1a$ is a silicon substrate, the emitter layer $2a$ is an N type impurity introduced a-Si:H layer, the base layers $3a$ and $3a'$ are P type impurity introduced a-Si:H superlattice layers, the barrier layer $4a$ is an a-$Si_xN_y$:H superlattice layer, the quantum well (well region) layer $5a$ is a P type impurity introduced a-Si:H superlattice layer, and the collector layer $6a$ is an N type impurity introduced a-Si:H layer.

Figure 14A:
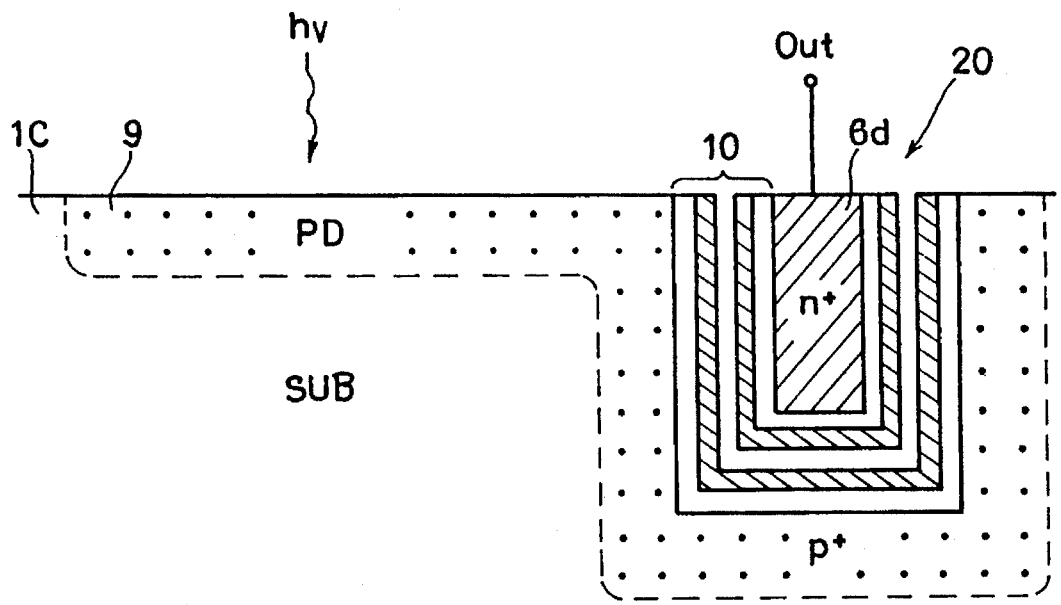
FIG. 14A is a diagram showing a schematic cross-sectional structure according to another embodiment of the present invention, where the present invention is applied to an avalanche photodiode of a multiple quantum well type.
Figure 14B:
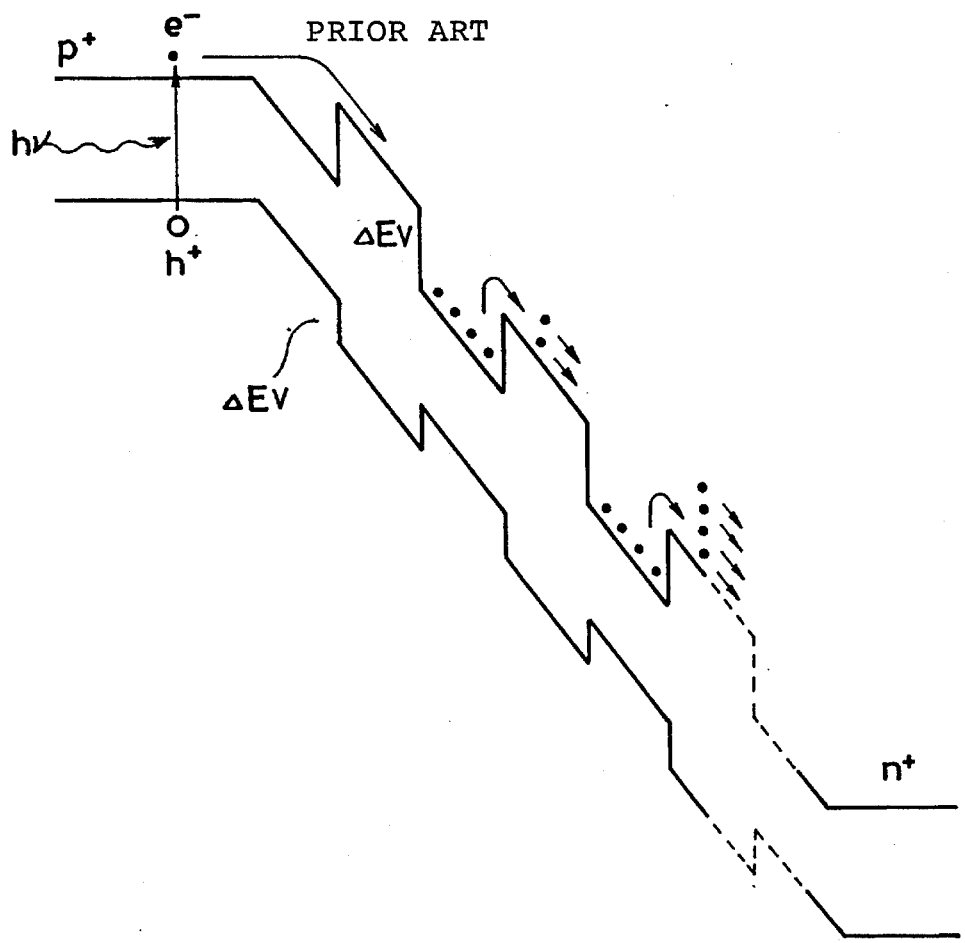
FIG. 14B is a diagram showing schematically the energy band profile in the avalanche photodiode shown in FIG. 14A.

Additionally, although in the above described embodiment, a semiconductor device using the resonant tunneling effect was described, the present invention can be also applied to a multiple quantum well (MQW) structure applied to an avalanche photodiode (APD) or the like. Referring now to FIGS. 14A and 14B, description is made on a structure and operation in which the present invention is applied to the avalanche photodiode.

FIG. 14A is a diagram showing schematically a cross-sectional structure in which a superlattice structure according to still another embodiment of the present invention is applied to the avalanche photodiode. In FIG. 14A, a trench region 20 is formed on the surface of a semiconductor substrate $1c$, a multiple quantum well layer 10 comprising superlattice layers is formed in the bottom portion and the sidewall portion of the trench region 20, and an $N^+$ type collector layer $6d$ is formed on the multiple quantum well layer 10. A $P^+$ type impurity diffusion region 9 is formed in the peripheral portion of the trench region 20, where a photodetector region is formed. As a method of manufacturing the avalanche photodiode shown in FIG. 14A, the trench region 20 is formed on the surface of the semiconductor substrate $1c$ by dry etching or the like, the photodetector layer 9 comprising a $P^+$ type diffusion layer is formed by implanting and diffusing P type impurities with a high concentration, the multiple quantum well structure 10 is formed by sequentially stacking superlattice layers each having a predetermined component and a thickness on the bottom surface and the sidewall of the trench region 20 by conventional MBE, MOCVD processes or the like, and the $N^+$ type collector layer $6d$ is formed. As a result, an avalanche photodiode comprising a multiple quantum well structure capable of also applying to very fine structure processing can be achieved.

FIG. 14B is a diagram showing schematically the potential energy profile of the avalanche photodiode comprising the multiple quantum well structure and the principle of operation thereof. Referring now to FIGS. 14A and 14B, description is made on the principle of operation. In this case, a so-called PIN type avalanche photodiode is formed, electrons are strongly bound in each quantum well region, and the resonant tunneling effect is not produced. When light h having more energy than an energy gap of the photodetector layer 9 is incident upon the $P^+$ type photodetector layer 9, electron-hole pairs are produced in the photodetector layer 9, so that electrons are excited into the conduction band of the photodetector layer 9 to be sufficiently hot electrons, and moves toward the original quantum well region. Strongly bound electrons exist in the quantum well region. However, electrons flowing from the photodetector layer 9 excite bounded electrons in the quantum well region by ionization by collision, and excite hot electrons to reach an adjacent quantum well region beyond a barrier of the quantum well region. The ionization by collision of the bound electrons in each quantum well region is repeated every time electrons flow into each quantum well region.

By the electron multiplication effect, a sizeable number of electrons have been produced when electrons reach the $N^+$ layer $6d$. When coefficients $\alpha$ and $\beta$ of ionization of electrons and holes satisfy the condition $\alpha/\beta \leq 1$, noise (dark current or the like) can be constrained. This condition required for noise reduction is satisfied by setting a band discontinuity $\Delta Ec$ in the conduction band and a band discontinuity $\Delta Ev$ to a suitable value. Therefore, when a suitable band structure of a superlattice structure is formed by introduction of impurities, low noise can be achieved.

In an avalanche photodiode having low noise, since an amplification output portion (quantum well region) has a trench structure, an avalanche photodiode capable of extracting a sufficient output in the reduced area formed by very fine structure processing and sufficiently functioning in an integrated circuit device is formed by very fine structure processing.

Furthermore, although in the above described embodiment, superlattice layers having different energy gaps are stacked, a superlattice structure such as an NIPI structure which is obtained by suitable dopant modulation in superlattice layers having identical band gaps and different band structures, can provide the same effect as the above described embodiment.

Figure 15:
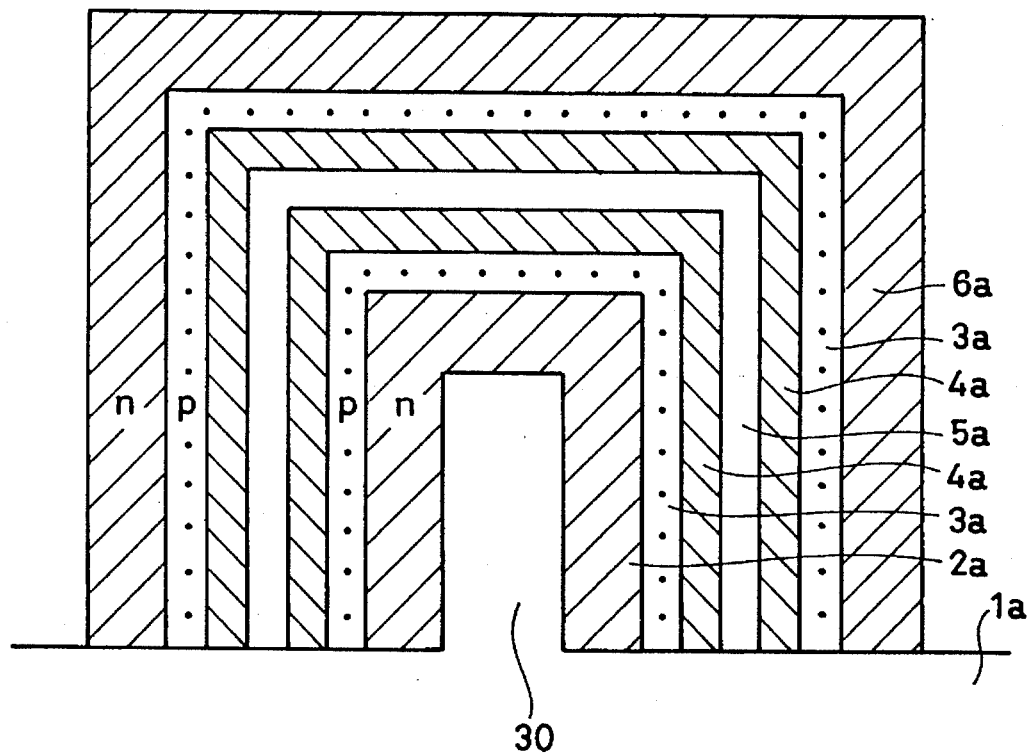
FIG. 15 is a diagram showing a schematic cross-sectional structure of a superlattice semiconductor device according to still another embodiment of the present invention, where a projected region is provided on the surface of a semiconductor substrate.

Additionally, although in the above described embodiment, a superlattice structure is formed in the bottom surface portion and the sidewall portion in a trench region formed on the surface of a semiconductor substrate, it is not intended to limit the present invention to the same. For example, as shown in FIG. 15, a projected portion or a convex portion 30 may be formed on the surface of a semiconductor substrate $1a$ and a superlattice structure may be formed using the upper surface portion and the side surface portion of the projected portion 30, in which case a superlattice semiconductor apparatus can be achieved which is capable of sufficiently overcoming a problem of decrease in the area in a structure formed by very fine structure processing. The projected portion 30 can be formed in the same manner as the trench region. In a structure in which the projected region 30 is formed shown in FIG. 15, if a contact region for providing electrical contact to each layer is formed on the surface of the semiconductor substrate in a region other than the projected region, occurrence of a leak and decrease in breakdown voltage can be prevented.

As described in the foregoing, according to the present invention, a superlattice structure in a superlattice semiconductor device is formed in the bottom surface portion and the sidewall portion of a trench region on the surface of a semiconductor substrate or the upper surface portion and the sidewall portion of a projected portion on the surface of the semiconductor substrate. A problem of decrease in the area can be sufficiently overcome by the presence of the sidewall portion of the trench region or the sidewall portion of a convex region even if the area occupied by the superlattice semiconductor device is decreased in a structure formed by very fine structure processing or the like. Thus, a superlattice semiconductor device thereby produced is capable of operating with sufficient accuracy even if the superlattice semiconductor device is used in a semiconductor integrated circuit device formed by very fine structure processing that otherwise would deteriorate the characteristics of the superlattice semiconductor device. In addition, since a contact region for providing electrical contact to the superlattice semiconductor device is formed on the surface of the semiconductor substrate in a region other than the trench region or the projected portion, an electrode never contacts the other region in the contact region, a leak or the like never occurs in the contact region and breakdown voltage never decreases, so that a superlattice semiconductor device adaptable to very fine structure processing can be achieved with high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photoresponsive superlattice semiconductor structure, having a first semiconductor region of first conductivity type responsive to light for producing minority carriers therein, a plurality of thin layers alternating between a first semiconductor composition and a second semiconductor composition to produce a plurality of stepped variations in the energy band thereof occupied by said minority carriers, and a second semiconductor region of a second conductivity type opposite to said first conductivity type, said plurality of thin layers disposed between said first semiconductor region and said second semiconductor region, said semiconductor structure being formed in a semiconductor body having a major surface and a stepped surface portion spaced from said major surface in a direction normal thereto and a side surface portion connecting said major surface and said stepped surface portion, wherein said first semiconductor region extends along said major surface, said side surface portion, and said stepped surface portion, and wherein said plurality of thin layers extends along said side surface portion and said stepped surface portion, without covering at least a part of said first semiconductor region extending along said major surface.

* * * * *